United States Patent
Min

(10) Patent No.: US 7,605,016 B2
(45) Date of Patent: Oct. 20, 2009

(54) CMOS IMAGE SENSOR AND METHOD OF MANUFACTURING THE SAME

(75) Inventor: Dae Hong Min, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 130 days.

(21) Appl. No.: 11/646,797

(22) Filed: Dec. 27, 2006

(65) Prior Publication Data

US 2007/0155084 A1    Jul. 5, 2007

(30) Foreign Application Priority Data

Dec. 29, 2005    (KR) .................... 10-2005-0133786

(51) Int. Cl.
*H01L 21/00* (2006.01)

(52) U.S. Cl. .............. 438/73; 438/401; 438/462; 438/703; 438/981; 257/E21.267; 257/E21.49

(58) Field of Classification Search ............. 257/294, 257/620, 641, E21.267, E21, 49; 438/199, 438/401, 699, 954, 73, 462, 703, 981
See application file for complete search history.

(56) References Cited

U.S. PATENT DOCUMENTS

| | | | |
|---|---|---|---|
| 5,629,557 A * | 5/1997 | Yamaha | 257/620 |
| 6,025,279 A * | 2/2000 | Chiang et al. | 438/760 |
| 6,617,189 B1 * | 9/2003 | Chen et al. | 438/48 |
| 2006/0163700 A1 * | 7/2006 | Bae | 257/620 |
| 2007/0032015 A1 * | 2/2007 | Itoh et al. | 438/250 |
| 2007/0126084 A1 * | 6/2007 | Bang et al. | 257/620 |
| 2008/0036485 A1 * | 2/2008 | Nagai | 324/765 |

* cited by examiner

*Primary Examiner*—M. Wilczewski
*Assistant Examiner*—Toniae M Thomas
(74) *Attorney, Agent, or Firm*—The Law Offices of Andrew D. Fortney; Andrew D. Fortney; Duangkamol Kay Strohl

(57) ABSTRACT

Disclosed are a CMOS sensor and a method of fabricating the CMOS sensor. The method includes the steps of: forming a first USG layer on an entire surface of a semiconductor substrate including a cell area and a scribe area; masking the cell area, and then removing the first USG layer formed on the scribe area; forming a SiN layer on the entire surface of the semiconductor substrate; masking the cell area, and then removing the SiN layer formed on the scribe area; forming a second USG layer on the entire surface of the semiconductor substrate; and masking the scribe area, and then removing the second USG layer formed on the cell area. The USG layer is only formed on the scribe layer without the SiN layer, so that SiN particles do not drop onto the USG layer during the sintering process.

11 Claims, 3 Drawing Sheets

CMOS IMAGE SENSOR AND METHOD OF MANUFACTURING THE SAME

BACKGROUND OF THE INVENTION

1. Field of the Invention

The present invention relates to an image sensor. More particularly, the present invention relates an image sensor having an improved light receiving function.

2. Description of the Related Art

In general, image sensors are semiconductor devices for converting optical images into electric signals, and are mainly classified into a CCD (Charge Coupled Device) image sensor and a CMOS (Complementary Metal Oxide Semiconductor) image sensor.

The CMOS image sensor includes a photodiode for detecting light and a logic circuit for converting detected light into electric signals to make them as data. As quantity of light received in the photodiode increases, the photo sensitivity of the image sensor is improved.

To improve the photo sensitivity, either a fill factor, which is a ratio of a photodiode area to the whole area of the image sensor, must be increased, or a photo-gathering technology is used to change the path of light incident onto an area other than the photodiode area such that the light can be gathered in the photodiode.

A representative example of the photo-gathering technology is to make a micro-lens. That is, a convex micro-lens is formed on a top surface of the photodiode using a material having superior light transmittance, thereby refracting the path of incident light in such a manner that a greater amount of light can be transmitted into the photo-diode area.

Hereinafter, a method of manufacturing a conventional CMOS image sensor will be described with reference to the attached drawings.

FIG. 1 is a schematic sectional view illustrating a conventional CMOS image sensor.

As shown in FIG. 1, the conventional CMOS image sensor has a cell area and a scribe area. The cell area includes a semiconductor substrate 11, a metal interconnection 12, an interlayer dielectric layer 13, and a SiN layer 14.

In addition, the scribe area includes the semiconductor substrate 11, the interlayer dielectric layer 13, and the SiN layer 14.

The interlayer dielectric layer 13 includes a USG (undoped silicate glass) layer.

Although not shown in the drawings, red, green and blue color filter layers are formed on the SiN layer 14, a planar layer and a micro-lens are sequentially formed on the color filter layers.

Hereinafter, a process of forming a contact hole of the interlayer dielectric layer 13 and the SiN layer 14 of the CMOS image sensor will be described.

First, after forming the USG layer having a thickness of about 10000 Å and a TEOS (Tetra Ethyl Ortho Silicate) having a thickness of about 4000 Å, a CMP (Chemical Mechanical Polishing) process is performed to reduce the thickness by 4000 Å to form the interlayer dielectric layer.

Then, the SiN layer is formed on the interlayer dielectric layer.

After that, a photoresist film is deposited. The photoresist film is subject to the exposure and development process to form a photoresist pattern form forming a contact hole.

Then, the SiN layer and the interlayer dielectric layer (USG layer) are etched by using the patterned photoresist film as a mask, thereby forming the contact hole.

In addition, the SiN layer and the interlayer dielectric layer (USG layer) are sintered, thereby obtaining final interlayer dielectric layer and SiN layer.

After obtaining the interlayer dielectric layer and SiN layer, the color filter layers are formed.

However, according to the above conventional CMOS image sensor, adhesion force between the USG layer and the SiN layer may be lowered at the scribe area during the sintering process.

Since the cell area is densely packed with metal patterns, etc., adhesion force between the USG layer and the SiN layer may not be lowered at the cell area during the sintering process.

However, the scribe area is prepared in the form of a wide dummy area without including the metal patterns. For this reason, SiN particles may drop onto the USG layer during the sintering process, thereby causing fatal damage to the image sensor after the subsequent process (color filter process) has been completed.

SUMMARY OF THE INVENTION

The present invention has been made to solve the above-mentioned problem(s), and a first object of the present invention is to provide a method of manufacturing a CMOS image sensor, capable of preventing SiN particles from dropping onto a USG layer such that damage is not caused to the CMOS image sensor.

A second object of the present invention is to provide a CMOS sensor capable of preventing SiN particles from dropping onto a USG layer such that damage is not caused to the CMOS image sensor.

In order to accomplish the first object, the present invention provides a method of fabricating a CMOS sensor, the method comprising the steps of: forming a first USG layer on an entire surface of a semiconductor substrate including a cell area and a scribe area; masking the cell area, and then removing the first USG layer formed on the scribe area; forming a SiN layer on the entire surface of the semiconductor substrate; masking the cell area, and then removing the SiN layer formed on the scribe area; forming a second USG layer on the entire surface of the semiconductor substrate; and masking the scribe area, and then removing the second USG layer formed on the cell area.

That is, according to the present invention, the USG layer is only formed on the scribe layer without the SiN layer, so that SiN particles do not drop onto the USG layer during the sintering process.

The step of forming the first USG layer includes the sub-steps of: forming a USG layer; forming a TEOS layer; and removing the TEOS layer and a predetermined portion of the USG layer through chemical mechanical polishing (CMP).

The method further includes a step of forming contact holes in the first USG layer and the SiN layer formed on the cell area, after removing the second USG layer.

The step of forming the contact holes includes the sub-steps of: depositing a photoresist film on the SiN layer, and forming a photoresist pattern to form the contact holes through an exposure and development process; forming the contact holes by etching the SiN layer and the first USG layer using the photoresist pattern as an etch mask; and sintering the SiN layer and the first USG layer.

The method may further include a step of forming color filter layers, after forming the contact holes.

The method may further include a step of forming a metal interconnection, before the first USG layer is formed on the entire surface of the semiconductor substrate.

In order to accomplish the second object, the present invention provides a CMOS sensor comprising: a semiconductor substrate including a cell area and a scribe area; a first USG layer and a SiN layer, which are sequentially formed on the cell area of the semiconductor substrate; and a second USG layer formed on the scribe area of the semiconductor substrate.

DETAILED DESCRIPTION OF THE INVENTION

Hereinafter, preferred embodiments of the present invention will be described with reference to accompanying drawings.

Figure 1:
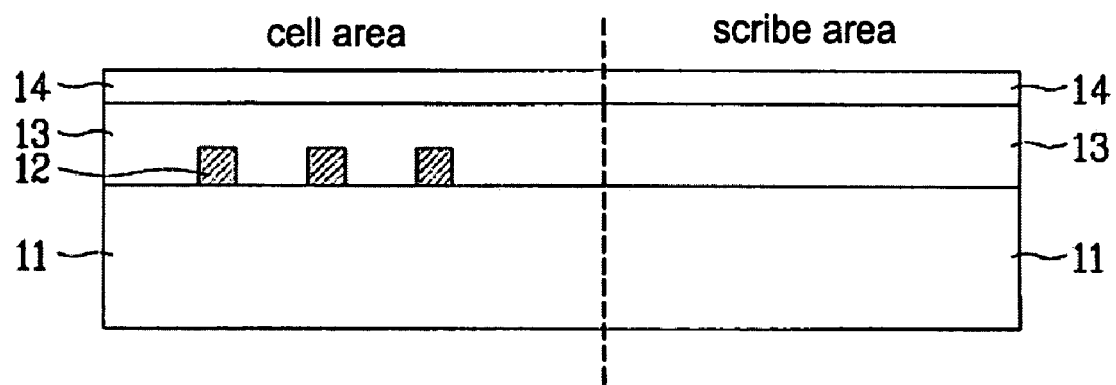
FIG. 1 is a schematic sectional view illustrating a conventional CMOS image sensor.
Figure 2A:
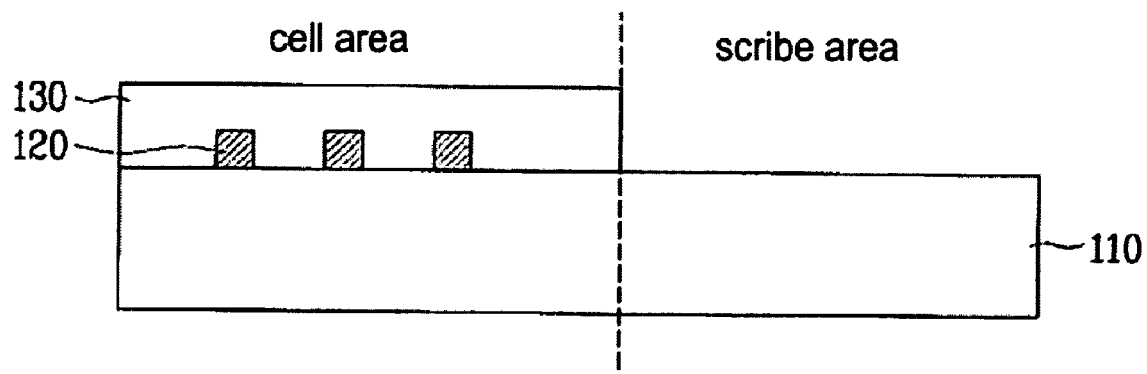
FIGS. 2A to 2C are schematic sectional views illustrating the procedure for manufacturing a CMOS image sensor according to an embodiment of the present invention.
Figure 2B:
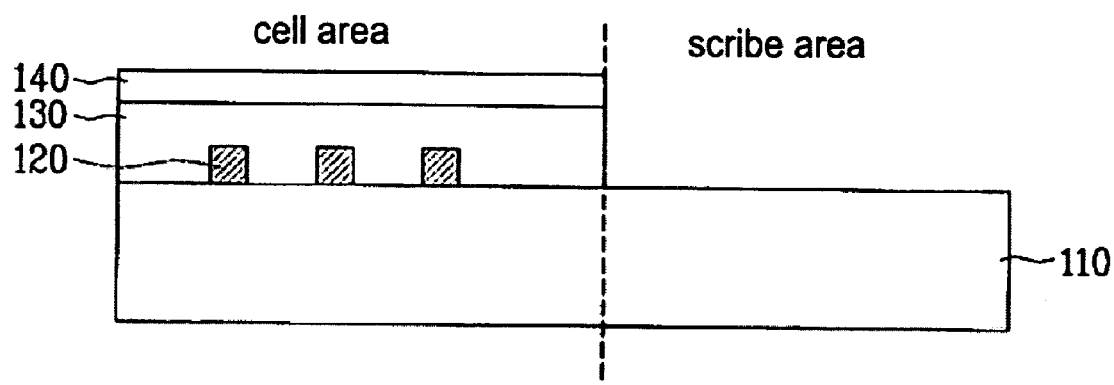
Figure 2C:
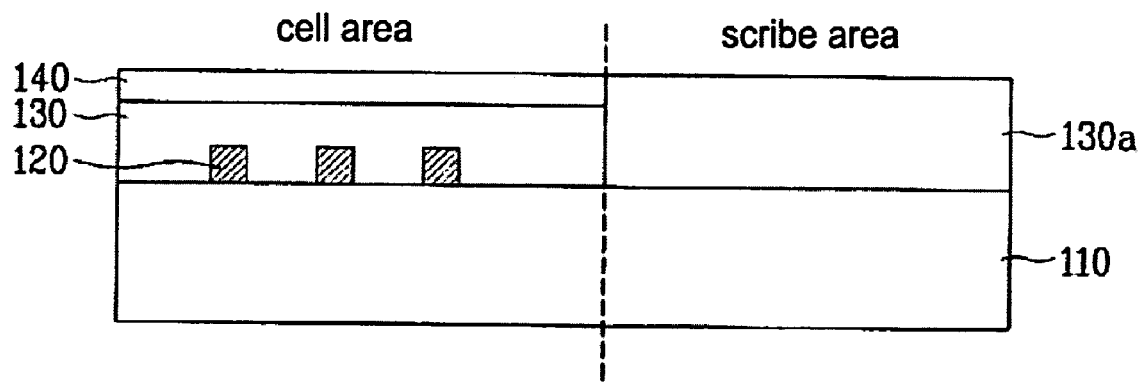

FIGS. 2A to 2C are schematic sectional views illustrating the procedure for manufacturing a CMOS image sensor according to an embodiment of the present invention.

First, as shown in FIG. 2A, a metal interconnection 120 is formed on a semiconductor substrate 110 including a cell area and a scribe area.

After that, a first USG layer 130 is formed on the entire surface of the semiconductor substrate 110. Then, after masking the cell area, the first USG layer 130 formed on the scribe area is removed.

The process for forming the first USG layer 130 on the entire surface of the semiconductor substrate 110 includes steps of forming a USG layer and a TEOS layer, and removing the TEOS layer and a predetermined portion of the USG layer through the CMP process.

Next, as shown in FIG. 2B, a SiN layer 140 is formed on the entire surface of the semiconductor substrate 110. Then, after masking the cell area, the SiN layer 140 formed on the scribed area is removed.

After that, as shown in FIG. 2C, a second USG layer 130a is formed on the entire surface of the semiconductor substrate 110. Then, after masking the cell area, the second USG layer 130a formed on the cell area is removed.

Accordingly, the first USG layer 130, and the SiN layer 140 is formed on the cell area and the second USG layer 130a is formed on the scribe area. That is, since only the USG layer is formed on the scribe area, the SiN layer may not drop onto the USG layer during the sintering process, which is the subsequent process.

Next, although not shown in the drawings, contact holes are formed in the first USG layer 130 and the SiN layer 140 formed in the cell area, after the process shown in FIG. 2C has been finished.

The process for forming the contact holes includes the steps of depositing a photoresist film on the SiN layer 140, forming a photoresist pattern to form the contact holes through the exposure and development process, forming the contact holes by etching the SiN layer 140 and the first USG layer 130 using the photoresist pattern as an etch mask, and sintering the SiN layer 140 and the first USG layer 130.

Next, after forming the contact holes, the color filter layers are formed.

Figure 3:
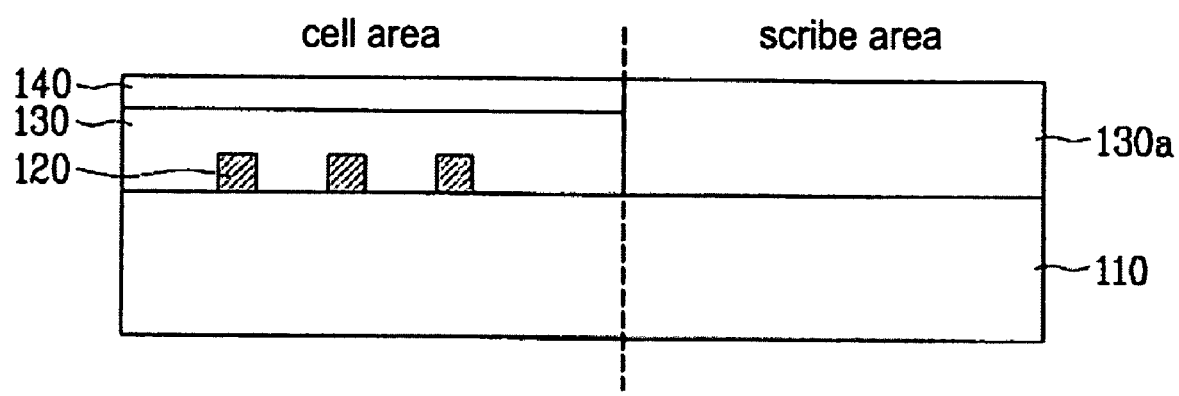
FIG. 3 is a schematic sectional view illustrating a CMOS image sensor according to an embodiment of the present invention.

FIG. 3 is a schematic sectional view illustrating a CMOS image sensor according to an embodiment of the present invention.

As shown in FIG. 3, the CMOS image sensor according to the present invention includes the semiconductor substrate 110 having the cell area and the scribe area, the first USG layer 130 and the SiN layer 140, which are sequentially formed on the cell area of the semiconductor substrate, and the second USG layer 130a formed on the scribe area of the semiconductor substrate 110.

In addition, a metal interconnection is formed below the first USG layer 130 formed on the cell area.

Although not shown in the drawings, the color filter layers are formed on the SiN layer 140 formed on the cell area.

As described above, according to the present invention, the USG layer is only formed on the scribe layer without the SiN layer, so that SiN particles may not drop onto the USG layer during the sintering process, thereby improving the characteristics of the CMOS image sensor.

What is claimed is:

1. A method of fabricating a CMOS sensor, the method comprising the steps of:
   forming a first oxide layer on an entire surface of a semiconductor substrate including a cell area and a scribe area, wherein the step of forming the first oxide layer includes the sub-steps of forming an oxide layer, forming a TEOS layer, and removing the TEOS layer and a predetermined portion of the oxide layer by chemical mechanical polishing (CMP);
   masking the cell area, and then removing the first oxide layer in the scribe area;
   forming a SiN layer on the entire surface of the semiconductor substrate;
   masking the cell area, and then removing the SiN layer in the scribe area;
   forming a second oxide layer on the entire surface of the semiconductor substrate; and
   masking the scribe area, and then removing the second oxide layer in the cell area.

2. The method as claimed in claim 1, further comprising forming contact holes in the first oxide layer and the SiN layer in the cell area, after removing the second oxide layer.

3. The method as claimed in claim 2, wherein forming the contact holes includes:
   depositing a photoresist film on the SiN layer, and forming a photoresist pattern through an exposure and development process;
   forming the contact holes by etching the SiN layer and the first oxide layer using the photoresist pattern as an etch mask; and
   sintering the SiN layer and the first oxide layer.

4. The method as claimed in claim 2, further comprising, after forming the contact holes, forming color filters.

5. The method as claimed in claim 4, wherein the color filters are formed on the SiN layer in the cell area.

6. The method as claimed in claim 1, further comprising forming a metal interconnection, before forming the first oxide layer.

7. The method as claimed in claim 1, wherein the second oxide layer in the scribe area has a thickness about equal to a thickness of the combined SiN layer and first oxide layer in the cell area.

8. The method as claimed in claim 1, wherein the first oxide layer comprises a first USG layer.

9. The method as claimed in claim 8, wherein the second oxide layer comprises a second USG layer.

10. The method as claimed in claim 1, wherein the second oxide layer comprises USG.

11. The method of claim 1, wherein the oxide layer comprises a first USG layer.

* * * * *